United States Patent
Chen et al.

(10) Patent No.: US 12,484,360 B2
(45) Date of Patent: Nov. 25, 2025

(54) MECHANISMS FOR FABRICATING MICRO-LEDS

(71) Applicant: Saphlux, Inc., San Diego, CA (US)

(72) Inventors: Chen Chen, San Diego, CA (US); Jie Song, San Diego, CA (US)

(73) Assignee: Saphlux, Inc., San Diego, CA (US)

( * ) Notice: Subject to any disclaimer, the term of this patent is extended or adjusted under 35 U.S.C. 154(b) by 0 days.

(21) Appl. No.: 19/054,743

(22) Filed: Feb. 14, 2025

(65) Prior Publication Data
US 2025/0194318 A1    Jun. 12, 2025

Related U.S. Application Data

(63) Continuation of application No. PCT/US2024/054001, filed on Oct. 31, 2024.

(60) Provisional application No. 63/594,947, filed on Oct. 31, 2023.

(51) Int. Cl.
| | |
|---|---|
| H01L 33/00 | (2010.01) |
| H10H 20/01 | (2025.01) |
| H10H 29/01 | (2025.01) |
| H10H 20/825 | (2025.01) |

(52) U.S. Cl.
CPC .... H10H 29/012 (2025.01); H10H 20/01335 (2025.01); H10H 20/825 (2025.01)

(58) Field of Classification Search
None
See application file for complete search history.

(56) References Cited

U.S. PATENT DOCUMENTS

| | | | |
|---|---|---|---|
| 2008/0315220 A1 | 12/2008 | Lee et al. | |
| 2009/0224364 A1 | 9/2009 | Oh et al. | |
| 2010/0001257 A1 | 1/2010 | Yu et al. | |
| 2015/0333223 A1* | 11/2015 | Wu | H10H 20/01 438/27 |
| 2018/0247922 A1* | 8/2018 | Robin | H01L 25/167 |
| 2018/0331153 A1* | 11/2018 | Robin | H10H 20/01 |
| 2021/0288036 A1* | 9/2021 | Pendse | H01L 21/6835 |
| 2021/0288037 A1 | 9/2021 | Tao et al. | |

* cited by examiner

Primary Examiner — Bradley Smith
(74) Attorney, Agent, or Firm — Jaffery Watson Hamilton & DeSanctis LLP

(57) ABSTRACT

In some embodiments, methods for fabricating micro-LEDs may include bonding a semiconductor wafer to a Complementary Metal-Oxide-Semiconductor (CMOS) wafer via one or more adhesive layers, etching the LED epilayer and the one or more adhesive layers to form a plurality of micro-LED structures, and fabricating an electrode layer on the plurality of micro-LED structures. The semiconductor wafer may include an LED epilayer including an n-GaN layer, a p-GaN layer, and an active layer positioned between the n-GaN layer and the p-GaN layer. Prior to the bonding of the semiconductor layer to the CMOS wafer, a stress release pattern may be formed in the LED epilayer. The stress release pattern may include a plurality of geometrical shapes (e.g., squares, rectangles, hexagons, rings, etc.) that may facilitate the release of mechanical stresses induced during the subsequent processing of the semiconductor wafer and/or the fabrication of the micro-LEDs.

10 Claims, 6 Drawing Sheets

MECHANISMS FOR FABRICATING MICRO-LEDS

CROSS-REFERENCE TO RELATED APPLICATIONS

The present application is a continuation of International Patent Application No. PCT/US2024/054001, filed Oct. 31, 2024, which claims the benefits of U.S. Patent Application No. 63/594,947, filed Oct. 31, 2023, each of which is incorporated by reference herein in its entirety.

TECHNICAL FIELD

The implementations of the disclosure relate generally to semiconductor fabrication and, more specifically, to micro-size light-emitting devices (micro-LEDs) and mechanisms for fabricating the same. The micro-LEDs may have dimensions on the scale of micrometers.

BACKGROUND

Existing solutions for LED fabrication typically involve fabricating micro-LEDs on or affixing micro-LEDs to substrates with dimensions often limited to a smaller scale, typically around 2 inches. It might be desirable to enable scalable manufacturing of micro-LEDs on substrates with substantially larger dimensions (e.g., 4-inch wafers, 6-inch wafers, etc.).

SUMMARY

The following is a simplified summary of the disclosure in order to provide a basic understanding of some aspects of the disclosure. This summary is not an extensive overview of the disclosure. It is intended to neither identify key or critical elements of the disclosure, nor delineate any scope of the particular implementations of the disclosure or any scope of the claims. Its sole purpose is to present some concepts of the disclosure in a simplified form as a prelude to the more detailed description that is presented later.

According to one or more aspects of the present disclosure, methods for fabricating micro-LEDs are provided. The methods include bonding a semiconductor wafer to a Complementary Metal-Oxide-Semiconductor (CMOS) wafer via one or more adhesive layers; etching the LED epilayer and the one or more adhesive layers to form a plurality of micro-LED structures; and fabricating an electrode layer on the plurality of micro-LED structures. The semiconductor wafer includes a first substrate, an LED epilayer formed on the first substrate, and a stress release pattern that divides the LED epilayer into a plurality of portions. The CMOS wafer includes a second substrate and a plurality of interconnects formed on the second substrate.

In some embodiments, the LED epilayer includes a plurality of epitaxial layers of gallium nitride.

In some embodiments, a dimension of the first substrate is equal to or greater than 6 inches.

In some embodiments, a dimension of the second substrate is equal to or greater than 6 inches.

In some embodiments, each of the plurality of micro-LED structures is fabricated on a respective interconnect of the plurality of interconnects.

In some embodiments, the methods further include fabricating a dielectric layer on the plurality of micro-LED structures, wherein the electrode layer is fabricated on the dielectric layer and the plurality of micro-LED structures.

In some embodiments, fabricating the electrode layer includes fabricating a layer of a conductive material on the dielectric layer and top surfaces of the plurality of micro-LED structures.

In some embodiments, the methods further include fabricating the stress release pattern in the semiconductor wafer by etching at least a portion of the LED epilayer.

In some embodiments, the stress release pattern includes one or more geometrical shapes that divide the LED epilayer into a plurality of segments.

In some embodiments, the plurality of interconnects includes a plurality of metallic pads or a plurality of metallic vias.

In some embodiments, bonding the semiconductor wafer to the CMOS wafer via the one or more adhesive layers includes coating a bonding material on the LED epilayer and the interconnects.

In some embodiments, at least a portion of the bonding material is coated on the first substrate through the stress release pattern.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding.

DETAILED DESCRIPTION

Figure 1A:
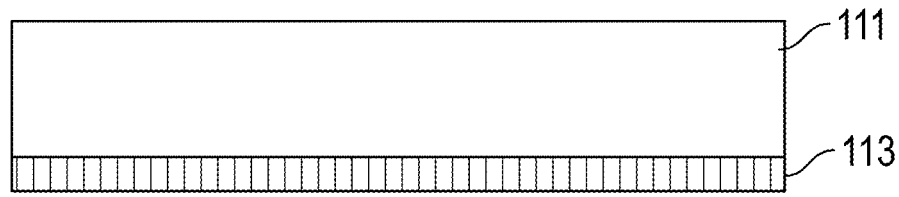
FIGS. 1A, 1B, 1D, 1E, 1F, 1G, 1H, 1I, 1J, and 1K are diagrams illustrating cross-sectional views of structures related to the fabrication of a semiconductor device incorporating micro-LEDs in accordance with some embodiments of the present disclosure.

Aspects of the disclosure provide for apparatuses incorporating micro light-emitting devices (LEDs) and methods of fabricating the same.

Existing solutions for LED fabrication typically involve fabricating micro-LEDs on or affixing micro-LEDs to substrates with dimensions often limited to a smaller scale, typically around 2 inches. The embodiments disclosed herein provide epitaxial bonding techniques that may enable the scalable manufacturing of micro-LEDs on substrates with substantially larger dimensions (e.g., 4-inch wafers, 6-inch wafers, etc.).

In some embodiments, methods for fabricating micro-LEDs may include bonding a semiconductor wafer to a Complementary Metal-Oxide-Semiconductor (CMOS) wafer via one or more adhesive layers, etching the LED epilayer and the one or more adhesive layers to form a plurality of micro-LED structures, and fabricating an electrode layer on the plurality of micro-LED structures. The semiconductor wafer may include an LED epilayer including an n-GaN layer, a p-GaN layer, and an active layer positioned between the n-GaN layer and the p-GaN layer.

Prior to the bonding of the semiconductor layer to the CMOS wafer, a stress release pattern may be formed in the LED epilayer. The stress release pattern may include a plurality of geometrical shapes (e.g., squares, rectangles, hexagons, rings, etc.) that may facilitate the release of mechanical stresses induced during the subsequent processing of the semiconductor wafer and/or the fabrication of the micro-LEDs.

Examples of embodiments of the present disclosure will be described in more detail with reference to the accompanying drawings. It should be understood that the following embodiments are given by way of illustration only to provide a thorough understanding of the disclosure to those skilled in the art. Therefore, the present disclosure is not limited to the following embodiments and may be embodied in different ways. Further, it should be noted that the drawings are not to precise scale and some of the dimensions, such as width, length, thickness, and the like, can be exaggerated for clarity of description in the drawings. Like components are denoted by like reference numerals throughout the specification.

FIGS. 1A, 1B, 1D, 1E, 1F, 1G, 1H, 1I, 1J, and 1K are diagrams illustrating cross-sectional views of structures related to the fabrication of a semiconductor device incorporating micro-LEDs in accordance with some embodiments of the present disclosure. FIG. 1C illustrates a top-down view of a semiconductor wafer with a stress release pattern in accordance with some embodiments of the present disclosure.

Referring to FIG. 1A, a semiconductor wafer 110 may be provided. The semiconductor wafer may include a substrate 111 (also referred to as the "first substrate") and an LED epilayer 113 fabricated on the substrate. The substrate 111 may be a silicon substrate in some embodiments. The semiconductor wafer 110 may have a dimension (e.g., a diameter) of 6 inches, 8 inches, 12 inches, etc. LED epilayer 113 may include one or more epitaxial layers of suitable materials for implementing a light-emitting device. For example, the LED epilayer may include an n-GaN layer, a P-GaN layer, and a quantum well structure situated between the n-GaN layer and the p-GaN layer. The LED epilayer 113 may be a continuous layer in some embodiments. As an example, LED epilayer 113 may be and/or include an LED epilayer 300 of FIG. 3.

Figure 1B:
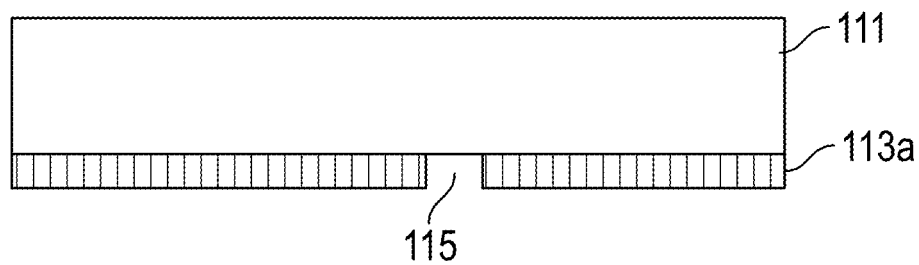
Figure 1C:
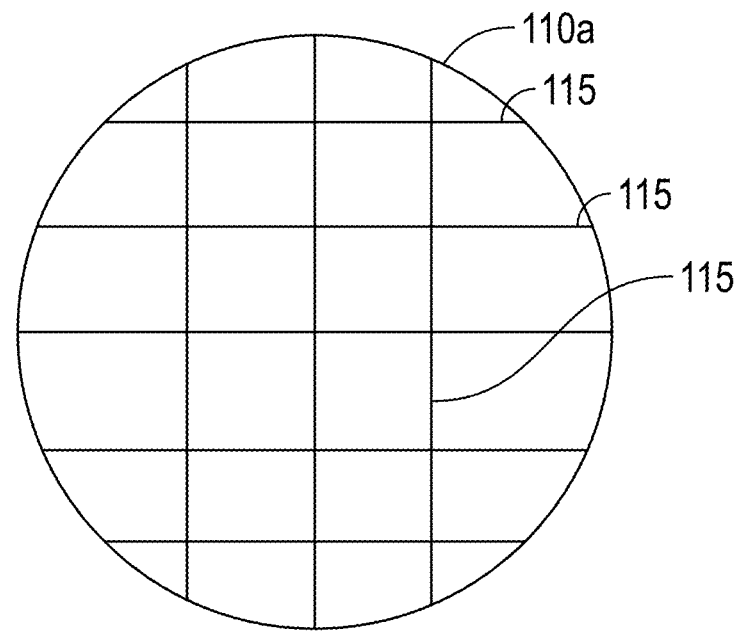
FIG. 1C illustrates a top-down view of a semiconductor wafer with a stress release pattern in accordance with some embodiments of the present disclosure.

As illustrated in FIG. 1B, a stress release pattern 115 may be formed on semiconductor wafer 110. The stress release pattern may include a plurality of geometrical shapes (e.g., squares, rectangles, hexagons, rings, etc.) that may facilitate the release of mechanical stresses induced during the subsequent processing of the semiconductor wafer and/or the fabrication of the micro-LEDs. The arrangement of the geometrical shapes may be regular or irregular. The geometrical shapes may divide LED epilayer 113 into multiple segments. The LED epilayer 113 with stress release pattern 115 is referred to as LED epilayer 113a. In some embodiments, the stress release pattern 115 may include a grid of squares, a plurality of trenches, etc., that are etched into the semiconductor wafer 110. The stress release pattern may be fabricated by etching the LED epi-structure 113 using lithographic techniques, wet or dry etching processes, etc. The depth, size, and spacing of these patterns can be adjusted depending on the anticipated stresses during the fabricating of the micro-LEDs. The spacing of the geometrical shapes may be significantly greater than a dimension of the micro-LEDs. In some embodiments, the spacing may be in the range of 1 cm to 5 cm. The width of the release pattern may be in the range of 100 μm to 1000 μm. The depth is thicker than the thickness of the LED epilayer. In some embodiments, the depth may be around 10 μm to 50 μm. FIG. 1C illustrates a top-down view of semiconductor wafer 110a in accordance with some embodiments of the present disclosure.

Figure 1D:
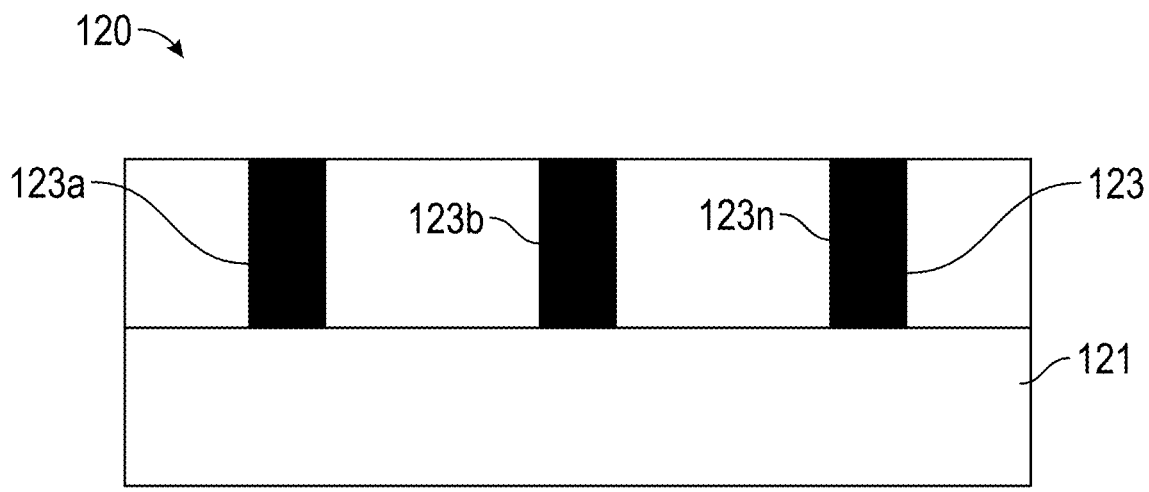

As shown in FIG. 1D, a CMOS (Complementary Metal-Oxide-Semiconductor) wafer 120 may be provided. The CMOS wafer may include a substrate 121 (also referred to as "the second substrate") and interconnects 123 fabricated on the substrate. In some embodiments, the CMOS wafer may further include transistors, control circuits, etc. fabricated on substrate 121. Substrate 121 may be a Si substrate or any other suitable type of substrate for LED fabrication. The interconnects 123 may be separated by dielectric materials 125. The interconnects may include metallic pads and/or metallic vias separated by dielectric materials. For example, the CMOS substrate may include interconnects 123a, 123b, . . . , 123n. Each of interconnects 123a-123n may be a metallic pad and/or a metallic via. While a certain number of interconnects are shown in FIG. 1D, this is merely illustrative. CMOS wafer 120 may include any suitable number of interconnects. Interconnects 123 may include metallic pads and metallic vias that are fabricated in an alternative manner. In particular, two adjacent layers of metallic pads may be connected via a layer of metallic vias. Two adjacent metallic vias may be connected via a layer of metallic pads.

Figure 1E:
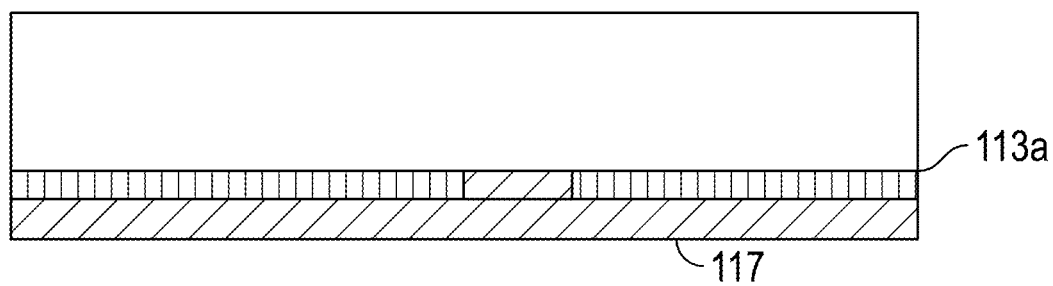
Figure 1E:
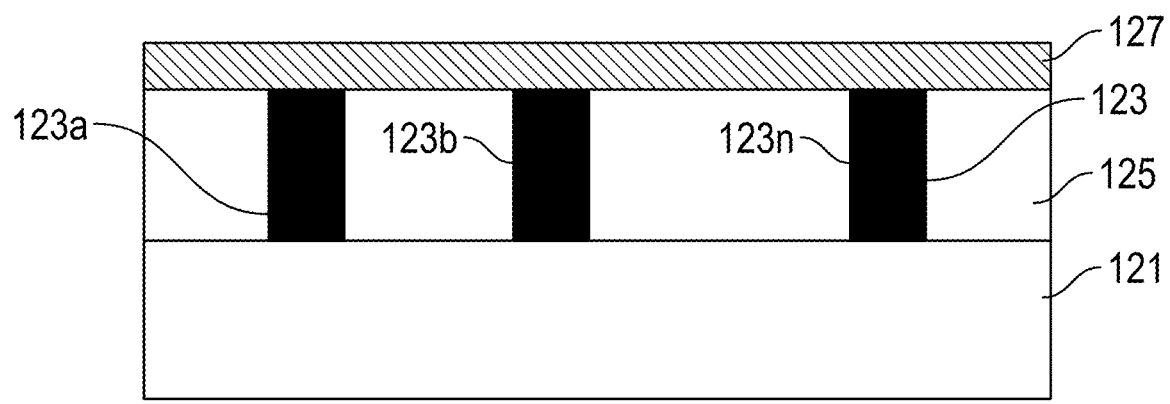
Figure 1F:
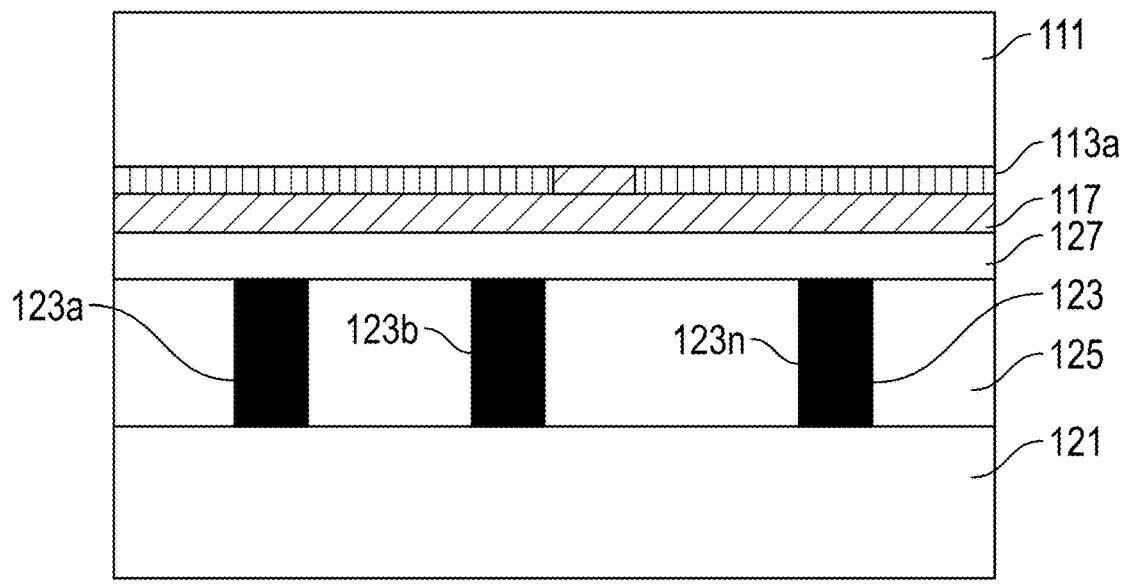

The semiconductor wafer 110a with the stress release pattern may then be bonded to the CMOS wafer 120. For example, an adhesive layer may be fabricated on a surface of the semiconductor wafer (also referred to as the "first surface") and a surface of the CMOS substrate (also referred to as the "second surface"), respectively. As shown in FIG. 1E, an adhesive layer 117 may be fabricated on LED epilayer 113a. One or more portions of adhesive layer 117 may fill in stress release pattern 115 and/or a portion of stress release pattern 115. As such, some of the bonding material (a portion of the adhesive layer 117) is coated on the first substrate 111 through the stress release pattern 115. An adhesive layer 127 may be fabricated on interconnects 123. The adhesive layers 117 and 127 may include any suitable bonding materials that are conductive, such as metals (e.g., Au, Sn, In, Ag, Ti, Pt, Ni, Al, etc.), etc. The bonding materials may be coated on the first surface and the second surface, respectively. As shown in FIG. 1F, the first surface with the coated bonding materials and the second surface with the coated bonding materials may then be bonded through adhesive layers 117 and 127.

Figure 1G:
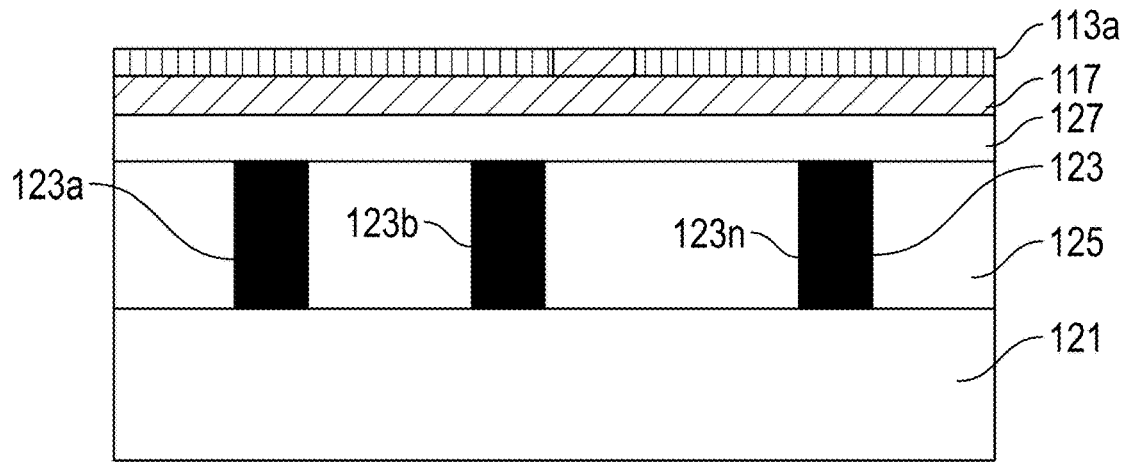

As shown in FIG. 1G, substrate 111 may be removed to expose a surface of LED epilayer 113a (also referred to as the top surface of LED epilayer 113a). In some embodiments, a portion of LED epilayer 113a may also be removed. For example, LED epilayer 113a may include a layer containing GaN (not shown) that may be removed or partially removed with substrate 111.

Figure 1H:
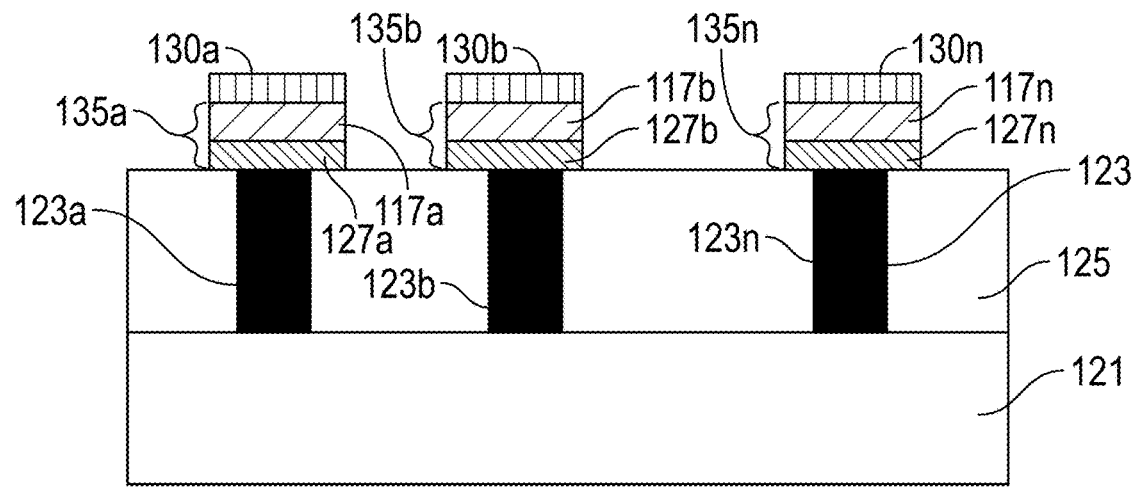

LED epilayer 113a, adhesive layer 117, and adhesive layer 127 may then be etched to form a plurality of micro-LED structures. As shown in FIG. 1H, the etching of LED epilayer 113a may form micro-LED structures 130a, 130b, . . . , 130n. The etching of adhesive layer 117 may form bonding pads 117a, 117b, . . . , 117n. The etching of adhesive layer 127 may form bonding pads 127a, 127b, . . . , 127n. Each micro-LED structure 130a-130n may be connected to an interconnect of CMOS wafer 120 through respective bonding pads. For example, micro-LED structure 130a is connected to interconnect 123a through bonding pads 117a and 127a. Micro-LED structure 130b is connected to interconnect 123*b* through bonding pads 117*b* and 127*b*. Micro-LED structure 130*n* is connected to interconnect 123*n* through bonding pads 117*n* and 127*n*. Bonding pads 117*a* and 127*a* may be collectively referred to as a bonding layer 135*a*. Bonding pads 117*b* and 127*b* may be collectively referred to as a bonding layer 135*b*. Bonding pads 117*n* and 127*n* may be collectively referred to as a bonding layer 135*n*. As bonding pads 117*a*, 117*b*, 117*n*, 127*a*, 127*b*, . . . , 127*n* include conductive materials, micro-LED structures 130*a*, 130*b*, . . . , 130*n* may be electrically connected to interconnects 123*a*, 123*b*, . . . , 123*n* through bonding layers 135*a*, 135*b*, . . . , 135*n*, respectively.

The micro-LED structures may have dimensions on the scale of micrometers. In one implementation, a dimension of the micro-LED may be approximately 5-25 µm. In another implementation, a dimension of the micro-LED may be greater than 25 µm or smaller than 5 µm. A pixel pitch between two micro-LED structures (e.g., two adjacent micro-LED structures) may be 20 µm, 25 µm, or of any other suitable value. In some embodiments, the pixel pitch may be equal to or greater than 20 µm. The pixel pitch may represent a distance between the light-emitting devices (e.g., a distance between a center of a first light-emitting device and a center of a second light-emitting device, a distance between a side of the first light-emitting device and a side of the second light-emitting device, etc.).

Figure 1I:
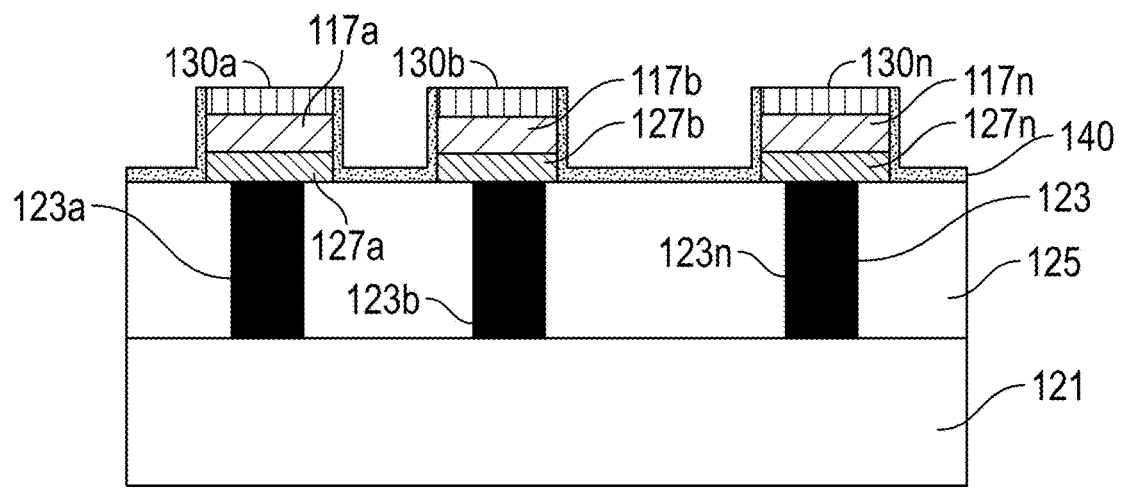

As shown in FIG. 1I, a dielectric layer 140 may be fabricated on the sidewalls of the micro-LED structures 130*a*-130*n*. Dielectric layer 140 may include any suitable dielectric material, such as $SiO_2$, $Si_3N_4$, etc. Dielectric layer 140 does not cover the top surface of micro-LED structures 130*a-n*. In some embodiments, dielectric layer 140 may further cover the sidewalls of bonding pads 117*a-n* and 127*a-n* and/or the top surfaces of dielectric materials 125.

Figure 1J:
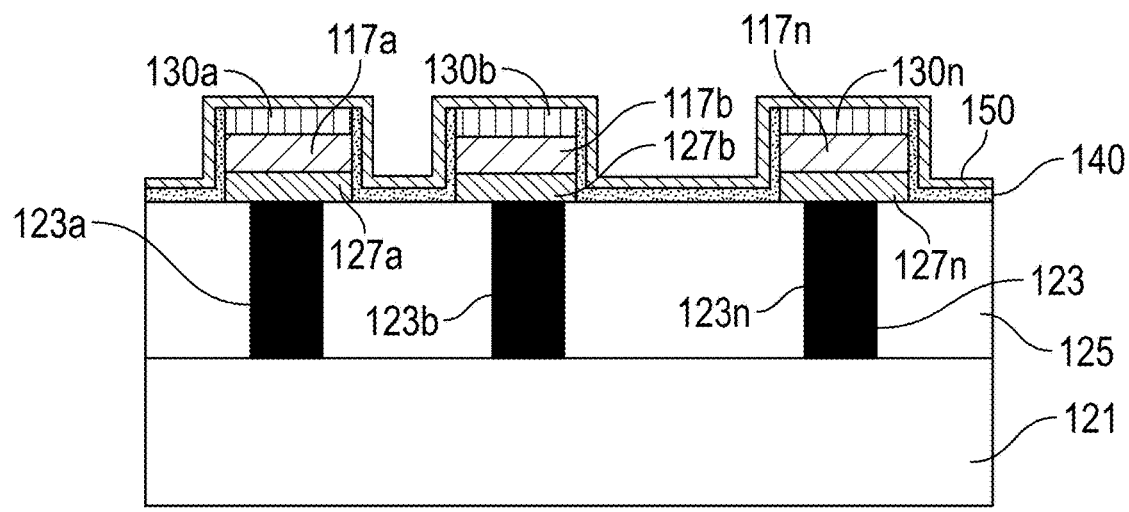
Figure 1K:
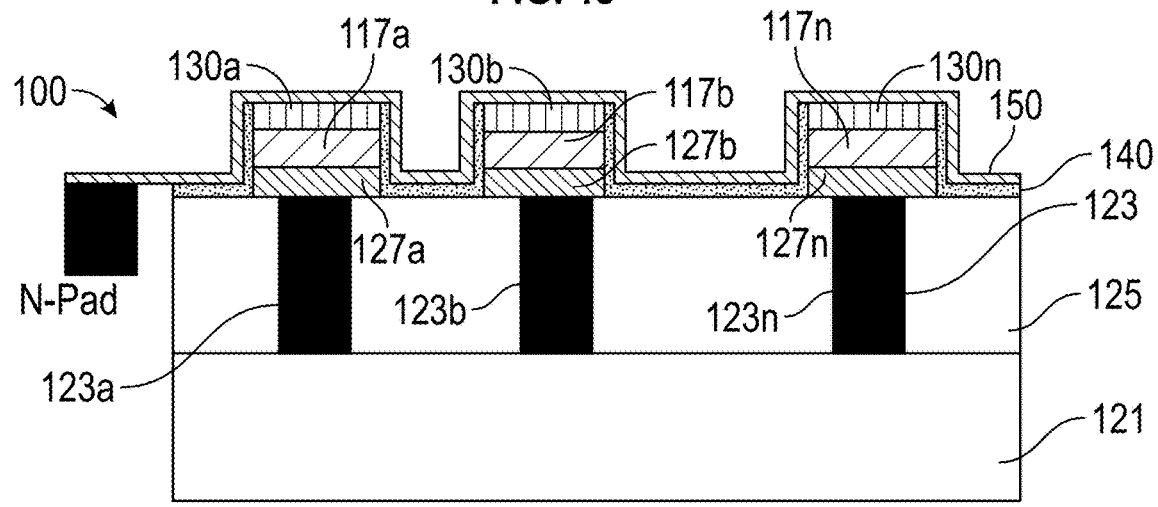

As shown in FIG. 1J, an electrode layer 150 may be fabricated on the top surfaces of micro-LED structures 130*a-n* and dielectric layer 140. Electrode layer 150 may include any suitable conductive material. In some embodiments, electrode layer 150 may include indium tin oxide (ITO) and any other suitable material to implement a transparent conductive electrode. In some embodiments, electrode layer 150 may be a continuous and/or substantially continuous layer of the conductive material. As shown in FIG. 1K, electrode layer 150 may directly contact an N-pad. The N-pad may include conductive materials, such as metal (e.g., aluminum, copper, tungsten, etc.), conductive oxides (e.g., ITO, zinc oxide, etc.), conductive nitrides (e.g., titanium nitride, aluminum nitride, etc.), etc. The electrode layer 150 may serve as the N-pads of the micro-LEDs. The interconnects 123 of the CMOS substrate may serve as the P-pads of the micro-LEDs.

According to one or more aspects of the present disclosure, a semiconductor device 100 is provided. The semiconductor device 100 may include a substrate 121 and a plurality of interconnects 123 fabricated on the substrate 121. A dimension of the substrate is greater than or equal to 6 inches in some embodiments. The interconnects 123 may include metallic pads and/or metallic vias. The interconnects 123 are separated by dielectric materials. The semiconductor device 100 further includes a plurality of micro-LED structures 130*a-n*. Each of the plurality of micro-LED structures 130*a-n* may include an LED epilayer 300 as described in connection with FIG. 3 below.

Each of the plurality of micro-LED structures is connected to a respective interconnect through one or more bonding pads. The bonding pads may include conductive bonding materials that may bond the micro-LED structure to the interconnect. The semiconductor device further includes an electrode layer 150 that is formed on the top surfaces of the micro-LED structures. The electrode layer 150 may be a continuous or substantially continuous layer in some embodiments. The electrode layer 150 may contact and/or be connected to an electrode pad (e.g., N-pad). Each of the interconnects may function as a respective P-pad for a micro-LED structure. The combination of a micro-LED structure, an interconnect (e.g., the P-pad), the bonding pads that bound the micro-LED structure to the interconnect, and the electrode layer may be regarded as a micro-LED device. The micro-LED devices may be individually controlled by utilizing the driving circuitry, transistors, interconnects, etc., of the CMOS wafer. An individual micro-LED device may be activated, and the micro-LED device may emit light in response to a voltage applied to the micro-LED device via the interconnect connected to the micro-LED and the electrode layer 150. A transistor or other suitable switch may provide access control for one or more micro-LED devices.

Figure 2:
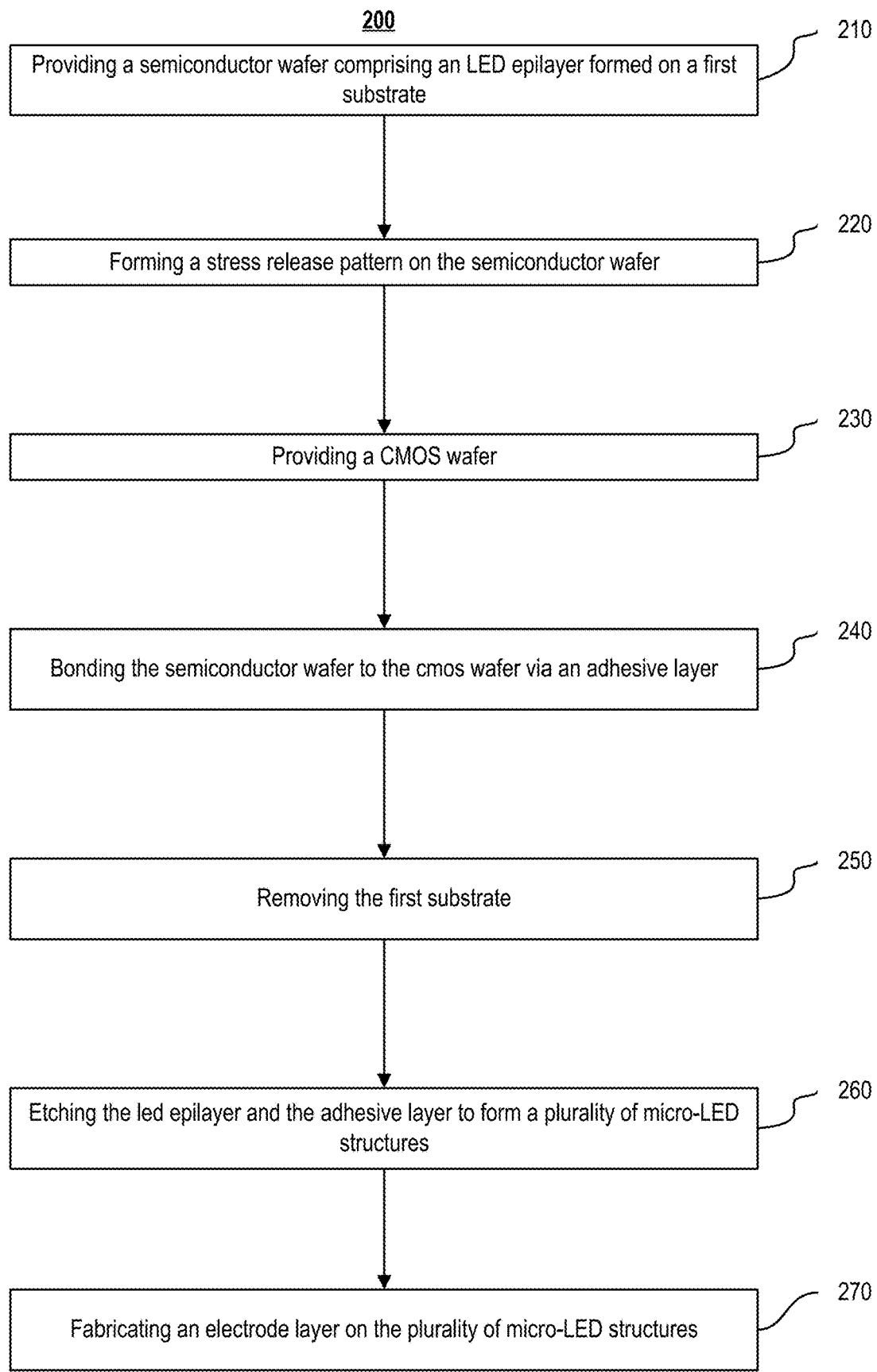
FIG. 2 is a flowchart illustrating an example method 200 for fabricating micro-LEDs in accordance with some embodiments of the present disclosure.

FIG. 2 is a flowchart illustrating an example method 200 for fabricating micro-LEDs in accordance with some embodiments of the present disclosure. Method 200 may be performed to fabricate semiconductor device 100 as described in connection with FIGS. 1A-1J above.

Method 200 may start at 210, where a semiconductor wafer comprising an LED epilayer may be provided. The semiconductor wafer may be the semiconductor wafer 110 of FIG. 1A. The LED epilayer may be the LED epilayer 113 of FIG. 1A. The LED epilayer may be formed on a first substrate (e.g., substrate 111 of FIG. 1A).

At 220, a stress release pattern (e.g., stress release pattern 115 of FIG. 1B) may be formed on the semiconductor wafer. Forming the stress release pattern may involve etching the LED epilayer to form a plurality of geometric shapes. The stress release pattern may divide the LED epilayer into a plurality of segments.

At 230, a CMOS wafer may be provided. The CMOS wafer may include a second substrate (e.g., substrate 121 of FIG. 1C) and a plurality of interconnects fabricated on the second substrate. In some embodiments, the CMOS wafer may further include transistors, control circuits, and/or other components fabricated on the second substrate. The second substrate may be a Si substrate or any other suitable type of substrate for LED fabrication. As an example, the CMOS wafer may be the CMOS wafer 120 as described in connection with FIG. 1C above.

At 240, the semiconductor wafer may be bonded to the CMOS wafer via one or more adhesive layers. In some embodiments, the adhesive layers may be adhesive layers 117 and/or 127 as described in connection with FIG. 1D. As an example, one or more bonding materials may be coated on the LED epilayer (e.g., LED epilayer 113*a* of FIG. 1E) and the interconnects. Some of the bonding materials may fill in the stress release pattern. As such, at least a portion of the bonding material is coated on the first substrate through the stress release pattern. Some of the bonding materials may be coated on the dielectric materials situated between the interconnects. The bonding materials are conductive.

At 250, the first substrate in the semiconductor wafer may be removed to expose the top surface of the LED epilayer. For example, the first substrate may be removed using a laser lift-off or any other suitable technique. In some embodiments, one or more portions of the LED epilayer may be removed as well.

At 260, the LED epilayer (e.g., LED epilayer 113*a* of FIG. 1F) and the adhesive layer may be etched to form a plurality of micro-LED structures (e.g., micro-LED structures 130a-n). The etching of the adhesive layer(s) may form a plurality of bonding pads (e.g., bonding pads 117a-n and 127a-n). Each of the micro-LED structures is connected to a respective interconnect of the CMOS wafer via one or more bonding pads.

At 270, an electrode layer may be fabricated on the plurality of micro-LED structures. For example, a dielectric layer may be formed on the sidewalls of micro-LED structures. The electrode layer may be formed on the dielectric layer. In some embodiments, fabricating the electrode layer may involve depositing a layer of suitable conductive material on the top surfaces of the micro-LED structures and the dielectric layer. In some embodiments, the electrode layer is a continuous layer that covers the top surface of each of the micro-LED structures and an electrode pad (e.g., an N-pad). The electrode layer may be, for example, the electrode layer 150 of FIGS. 1J and/or 1K.

Figure 3:
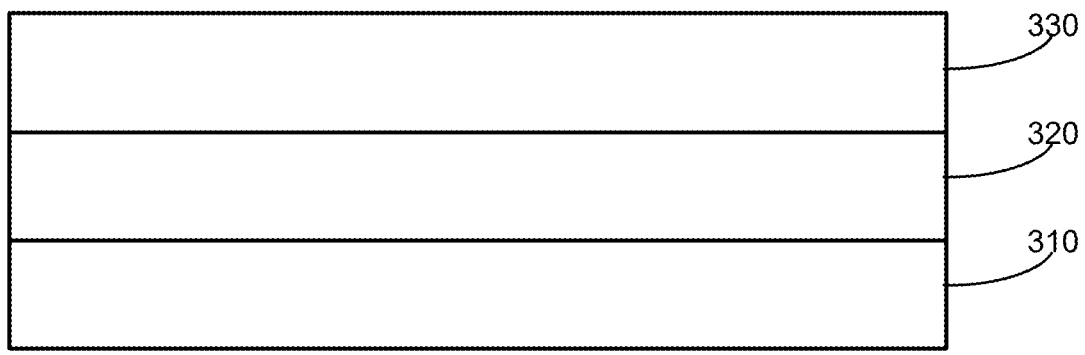
FIG. 3 illustrates a cross-sectional view of an example LED epilayer 300 in accordance with some embodiments of the present disclosure.

FIG. 3 illustrates a cross-sectional view of an example LED epilayer 300 in accordance with some embodiments of the present disclosure.

LED epilayer 300 may include a first epitaxial layer 310, a second epitaxial layer 320, and a third epitaxial layer 330. The first epitaxial layer 310 may include one or more epitaxial layers of group III-V materials and any other suitable semiconductor material. The group III-V material may be, for example, GaN. The first epitaxial layer of the group III-V material may include the group III-V material doped with a first conductive-type impurity. The first conductive-type impurity may be an n-type impurity in some embodiments. The first epitaxial layer of the group III-V material may be a Si-doped GaN layer or a Ge-doped GaN layer in some embodiments. The first epitaxial layer 310 may also include one or more epitaxial layers of the group III-V material that are not doped with any particular conductive-type impurity. The first epitaxial layer may also be referred to as an n-GaN layer in some embodiments.

Second epitaxial layer 320 may include one or more layers of semiconductor materials and/or any other suitable material for emitting light. For example, second epitaxial layer 320 may include an active layer comprising one or more quantum well structures for emitting light. Each of the quantum well structures may be and/or include a single quantum well structure (SQW) and/or a multi-quantum well (MQW) structure. Each of the quantum well structures may include one or more quantum well layers and barrier layers (not shown in FIG. 3). The quantum well layers and barrier layers may be alternately stacked on one another. The quantum well layers may comprise indium (e.g., indium gallium nitride). Each of the quantum well layers may be an undoped layer of indium gallium nitride (InGaN) that is not intentionally doped with impurities. Each of the barrier layers may be an undoped layer of the group III-V material that is not intentionally doped with impurities. A pair of a barrier layer (e.g., a GaN layer) and a quantum well layer (e.g., an InGaN layer) may be regarded as being a quantum well structure. Second epitaxial layer 320 may contain any suitable number of quantum well structures. For example, the number of the quantum well structures (e.g., the number of pairs of InGaN and GaN layers) may be 3, 4, 5, etc.

Third epitaxial layer 330 may include one or more epitaxial layers of the group III-V material and/or any other suitable material. For example, third epitaxial layer 330 can include an epitaxial layer of the group III-V material (also referred to as the "second epitaxial layer of the group III-V material"). The second doped layer of the group III-V material may be doped with a second conductive-type impurity that is different from the first conductive-type impurity. For example, the second conductive-type impurity may be a p-type impurity. In some embodiments, the second epitaxial layer of the group III-V material may be doped with magnesium. Third epitaxial layer 330 may also be referred to as a p-GaN layer in some embodiments.

When energized, second epitaxial layer 320 may produce light. For example, when an electrical current passes through the active layer, electrons from first epitaxial layer 310 (e.g., an n-doped GaN layer) may combine in the active layer with holes from third epitaxial layer 330 (e.g., a p-doped GaN layer). The combination of electrons and holes may produce light. In some embodiments, second epitaxial layer 320 may produce light of a certain color (e.g., light with a certain wavelength).

While certain layers of semiconductor materials are shown in FIG. 3, this is merely illustrative. For example, one or more intervening layers may or may not be formed between two semiconductor layers of FIG. 3 (e.g., between first epitaxial layer 310 and second epitaxial layer 320, between second epitaxial layer 320 and third epitaxial layer 330, etc.). In one implementation, a surface of first epitaxial layer 310 may directly contact a surface of second epitaxial layer 320. In another implementation, one or more intervening layers (not shown in FIG. 3) may be formed between the first epitaxial layer 310 and the second epitaxial layer 320. In some embodiments, first epitaxial layer 310 may include an undoped layer of the group III-nitride material. In some embodiments, LED epilayer 300 can include one or more layers of semiconductor materials and/or any other material that are formed on third epitaxial layer 330.

For simplicity of explanation, the methods of this disclosure are depicted and described as a series of acts. However, acts in accordance with this disclosure can occur in various orders and/or concurrently, and with other acts not presented and described herein. Furthermore, not all illustrated acts may be required to implement the methods in accordance with the disclosed subject matter. In addition, those skilled in the art will understand and appreciate that the methods could alternatively be represented as a series of interrelated states via a state diagram or events. Additionally, it should be appreciated that the methods disclosed in this specification are capable of being stored on an article of manufacture to facilitate transporting and transferring such methods to computing devices.

The terms "approximately," "about," and "substantially" may be used to mean within ±20% of a target dimension in some embodiments, within ±10% of a target dimension in some embodiments, within ±5% of a target dimension in some embodiments, and yet within ±2% in some embodiments. The terms "approximately" and "about" may include the target dimension.

In the foregoing description, numerous details are set forth. It will be apparent, however, that the disclosure may be practiced without these specific details. In some instances, well-known structures and devices are shown in block diagram form, rather than in detail, in order to avoid obscuring the disclosure.

The terms "first," "second," "third," "fourth," etc. as used herein are meant as labels to distinguish among different elements and may not necessarily have an ordinal meaning according to their numerical designation.

The words "example" or "exemplary" are used herein to mean serving as an example, instance, or illustration. Any aspect or design described herein as "example" or "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or". That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from context to be directed to a singular form. Reference throughout this specification to "an implementation" or "one implementation" means that a particular feature, structure, or characteristic described in connection with the implementation is included in at least one implementation. Thus, the appearances of the phrase "an implementation" or "one implementation" in various places throughout this specification are not necessarily all referring to the same implementation.

As used herein, when an element or layer is referred to as being "on" another element or layer, the element or layer may be directly on the other element or layer, or intervening elements or layers may be present. In contrast, when an element or layer is referred to as being "directly on" another element or layer, there are no intervening elements or layers present.

Whereas many alterations and modifications of the disclosure will no doubt become apparent to a person of ordinary skill in the art after having read the foregoing description, it is to be understood that any particular embodiment shown and described by way of illustration is in no way intended to be considered limiting. Therefore, references to details of various embodiments are not intended to limit the scope of the claims, which in themselves recite only those features regarded as the disclosure.

What is claimed is:

1. A method, comprising:
    bonding a semiconductor wafer to a Complementary Metal-Oxide-Semiconductor (CMOS) wafer via one or more adhesive layers, wherein the semiconductor wafer comprises a first substrate, an LED epilayer formed on the first substrate, and a stress release pattern that divides the LED epilayer into a plurality of portions, and wherein the CMOS wafer comprises a second substrate and a plurality of interconnects formed on the second substrate;
    etching the LED epilayer and the one or more adhesive layers to form a plurality of micro-LED structures;
    fabricating a dielectric layer on the plurality of micro-LED structures; and
    fabricating an electrode layer on the plurality of micro-LED structures, wherein fabricating the electrode layer comprises fabricating a layer of a conductive material on the dielectric layer and top surfaces of the plurality of micro-LED structures.

2. The method of claim 1, wherein the LED epilayer comprises a plurality of epitaxial layers of gallium nitride.

3. The method of claim 1, wherein a dimension of the first substrate is equal to or greater than 6 inches.

4. The method of claim 3, wherein a dimension of the second substrate is equal to or greater than 6 inches.

5. The method of claim 3, wherein each of the plurality of micro-LED structures is fabricated on a respective interconnect of the plurality of interconnects.

6. The method of claim 1, wherein the electrode layer is fabricated on the dielectric layer and the plurality of micro-LED structures.

7. A method, comprising:
    fabricating a stress release pattern in a semiconductor wafer by etching at least a portion of an LED epilayer of the semiconductor wafer, wherein the stress release pattern divides the LED epilayer into a plurality of portions;
    bonding the semiconductor wafer to a Complementary Metal-Oxide-Semiconductor (CMOS) wafer via one or more adhesive layers, wherein the semiconductor wafer comprises a first substrate, wherein the LED epilayer is formed on the first substrate, and wherein the CMOS wafer comprises a second substrate and a plurality of interconnects formed on the second substrate;
    etching the LED epilayer and the one or more adhesive layers to form a plurality of micro-LED structures; and
    fabricating an electrode layer on the plurality of micro-LED structures.

8. The method of claim 7, wherein the stress release pattern comprises one or more geometrical shapes that divide the LED epilayer into a plurality of segments.

9. The method of claim 1, wherein the plurality of interconnects comprises a plurality of metallic pads or a plurality of metallic vias.

10. A method, comprising:
    bonding a semiconductor wafer to a Complementary Metal-Oxide-Semiconductor (CMOS) wafer via one or more adhesive layers, wherein the semiconductor wafer comprises a first substrate, an LED epilayer formed on the first substrate, and a stress release pattern that divides the LED epilayer into a plurality of portions, and wherein the CMOS wafer comprises a second substrate and a plurality of interconnects formed on the second substrate, wherein bonding the semiconductor wafer to the CMOS wafer via the one or more adhesive layers comprises coating a bonding material on the LED epilayer and the interconnects, wherein at least a portion of the bonding material is coated on the first substrate through the stress release pattern;
    etching the LED epilayer and the one or more adhesive layers to form a plurality of micro-LED structures; and
    fabricating an electrode layer on the plurality of micro-LED structures.

* * * * *